(12) United States Patent
Lee

(10) Patent No.: US 10,497,433 B2
(45) Date of Patent: *Dec. 3, 2019

(54) NONVOLATILE MEMORY DEVICE INCLUDING FERROELECTRIC MEMORY ELEMENT AND RESISTIVE MEMORY ELEMENT, AND METHOD OF OPERATING NONVOLATILE MEMORY DEVICE

(71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/016,548

(22) Filed: Jun. 23, 2018

(65) Prior Publication Data
US 2019/0019551 A1    Jan. 17, 2019

(30) Foreign Application Priority Data
Jul. 14, 2017  (KR) .................. 10-2017-0089926

(51) Int. Cl.
| *G11C 11/22* | (2006.01) |
| *G11C 11/56* | (2006.01) |
| *H01L 27/1159* | (2017.01) |
| *H01L 29/51* | (2006.01) |
| *H01L 45/00* | (2006.01) |
| *G11C 13/00* | (2006.01) |
| *H01L 27/24* | (2006.01) |
| *H01L 29/78* | (2006.01) |

(52) U.S. Cl.
CPC ........ *G11C 11/5657* (2013.01); *G11C 11/223* (2013.01); *G11C 11/2275* (2013.01); *G11C 11/5678* (2013.01); *G11C 11/5685* (2013.01); *G11C 13/0004* (2013.01); *G11C 13/0007* (2013.01); *G11C 13/0069* (2013.01); *H01L 27/1159* (2013.01); *H01L 27/2436* (2013.01); *H01L 27/2463* (2013.01); *H01L 29/516* (2013.01); *H01L 29/517* (2013.01); *H01L 29/78391* (2014.09); *H01L 45/04* (2013.01); *H01L 45/06* (2013.01); *H01L 45/08* (2013.01); *H01L 45/1233* (2013.01); *H01L 45/142* (2013.01); *H01L 45/143* (2013.01); *H01L 45/144* (2013.01); *H01L 45/146* (2013.01); *H01L 45/147* (2013.01); *G11C 11/2273* (2013.01); *G11C 13/004* (2013.01); *G11C 2213/31* (2013.01); *G11C 2213/32* (2013.01)

(58) Field of Classification Search
CPC .................................. G11C 11/5657
USPC .................................. 365/145, 148
See application file for complete search history.

(56) References Cited

U.S. PATENT DOCUMENTS

| 6,284,577 B1 | 9/2001 | Suzawa et al. | |
| 2013/0048937 A1* | 2/2013 | Tong ....................... | H01L 45/04 257/2 |

(Continued)

*Primary Examiner* — Hoai V Ho

(57) ABSTRACT

A nonvolatile memory device according to one embodiment includes a ferroelectric memory element and a resistive memory element. The ferroelectric memory element includes a field effect transistor having a ferroelectric gate dielectric layer. The resistive memory element includes a resistance change memory layer disposed between a first memory electrode and a second memory electrode. A drain electrode of the field effect transistor is connected to the first memory electrode or second memory electrodes.

12 Claims, 13 Drawing Sheets

(56) References Cited

U.S. PATENT DOCUMENTS

2014/0355328 A1* 12/2014 Muller ................ G11C 11/2275
                                                              365/145
2018/0114560 A1*  4/2018 Kim .................. H01L 29/78391
2018/0300626 A1* 10/2018 Lee .......................... G06N 3/08
2019/0080230 A1*  3/2019 Hatcher ............... G06N 3/0635

* cited by examiner

FIG. 4C
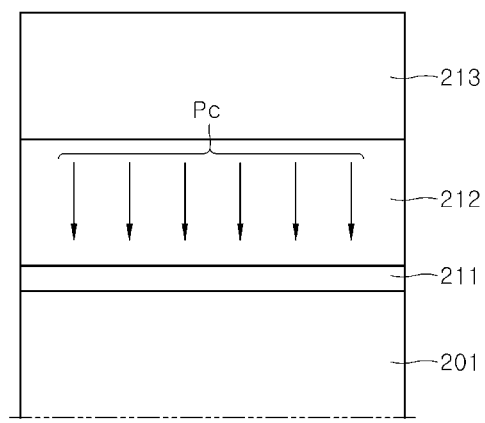
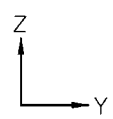

NONVOLATILE MEMORY DEVICE INCLUDING FERROELECTRIC MEMORY ELEMENT AND RESISTIVE MEMORY ELEMENT, AND METHOD OF OPERATING NONVOLATILE MEMORY DEVICE

CROSS-REFERENCE TO RELATED APPLICATION

The present application claims priority under 35 U.S.C 119(a) to Korean Patent Application No. 10-2017-0089926, filed on Jul. 14, 2017, which is herein incorporated by reference in its entirety.

BACKGROUND

1. Technical Field

Various embodiments of the present disclosure generally relate to a semiconductor device, and more particularly, relate to a nonvolatile memory device and a method of operating a nonvolatile memory device.

2. Related Art

A resistive memory device, having an operation mode different from that of a flash memory device, has been proposed as a nonvolatile memory device. A flash memory device stores information by using a characteristic in which electric charges of different quantities are stored in a charge storage layer as a result of an externally applied voltage. In contrast, in a resistive memory device, an electrical resistance of an internal memory element can be reversibly changed when an external voltage or current is applied, and an electrical resistance changed by the external voltage can be stored in a nonvolatile manner as an electrical signal in the memory element after the voltage or current is removed. The resistive memory device may include, for example, a magnetic random access memory (MRAM) device, a phase change random access memory (PCRAM) device, a resistive random access memory (ReRAM) device and the like.

SUMMARY

There is disclosed a nonvolatile memory device according to an aspect of the present disclosure. The nonvolatile memory device includes a ferroelectric memory element and a resistive memory element. The ferroelectric memory element includes a field effect transistor having a ferroelectric gate dielectric layer. The resistive memory element includes a resistance change memory layer disposed between a first memory electrode and a second memory electrode. A drain electrode of the field effect transistor is connected to the first memory electrode or the second memory electrode.

There is disclosed a method of operating a nonvolatile memory device according to another aspect of the present disclosure. In the method, a ferroelectric memory element and a resistive memory element is used in a memory cell. The ferroelectric memory element includes a field effect transistor having a ferroelectric gate dielectric layer, and a drain electrode. The resistive memory element includes a first memory electrode, a resistance change memory layer and a second memory electrode. A resistance writing voltage is applied to the resistance change memory layer to write a resistance in the resistive memory element. Remanent polarization of the ferroelectric gate dielectric layer is written by applying a polarization writing voltage to a gate electrode of the field effect transistor. The operation of writing a resistance and the operation of writing the remanent polarization are sequentially performed, and the drain electrode of the field effect transistor is connected to the first memory electrode or the second memory electrode.

BRIEF DESCRIPTION OF THE DRAWINGS

FIGS. 4A to 4C are cross-sectional views schematically illustrating a writing method of a ferroelectric memory element according to an embodiment of the present disclosure.

DETAILED DESCRIPTION

Figure 1:
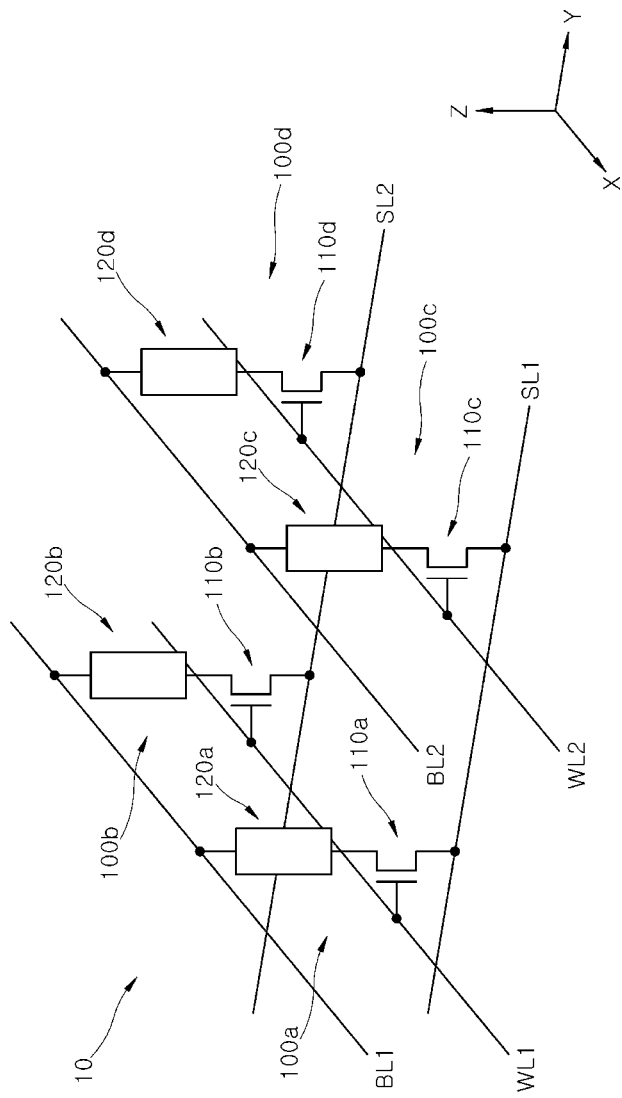
FIG. 1 is a schematic diagram illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition of one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as the stated order, may be performed substantially at the same time, or may be performed in a reverse order.

An embodiment of the present disclosure provides a nonvolatile memory device having a memory cell that stores a multi-level signal.

In addition, an embodiment of the present disclosure provides a method of writing a multi-level signal in the memory cell of the nonvolatile memory device and a method of reading the multi-level signal.

FIG. 1 is a schematic diagram schematically illustrating a nonvolatile memory device 10 according to an embodiment of the present disclosure.

Referring to FIG. 1, the nonvolatile memory device 10 may include a plurality of bit lines BL1 and BL2, a plurality of word lines WL1 and WL2, and a plurality of selection lines SL1 and SL2. The plurality of bit lines BL1 and BL2, and the plurality of word lines WL1 and WL2 may be arranged in an x-direction, and the plurality of selection lines SL1 and SL2 may be arranged in a y-direction that is not parallel to the x-direction. Although figures are illustrated herein using an orthogonal axis system, the disclosure need not be limited to thereto.

The nonvolatile memory device 10 may include a plurality of memory cells 100a, 100b, 100c and 100d. Hereinafter, for convenience of explanation, the plurality of memory cells 100a, 100b, 100c and 100d are referred to as a first memory cell 100a, a second memory cell 100b, a third memory cell 100c and a fourth memory cell 100d.

The first memory cell 100a may include a first ferroelectric memory element 110a and a first resistive memory element 120a. The second memory cell 100b may include a second ferroelectric memory element 110b and a second resistive memory element 120b. The third memory cell 100c may include a third ferroelectric memory element 110c and a third resistive memory element 120c. The fourth memory cell 100d may include a fourth ferroelectric memory element 110d and a fourth resistive memory element 120d.

The first memory cell 100a may be disposed between a first bit line BL1 and a first selection line SL1, which intersect with each other. A gate electrode of the first ferroelectric memory element 110a of the first memory cell 100a may be connected to a first word line WL1.

Likewise, the second memory cell 100b may be disposed between a first bit line BL1 and a second selection line SL2, which intersect with each other. In addition, a gate electrode of the second ferroelectric memory element 110b of the second memory cell 100b may be connected to the first word line WL1. The third memory cell 100c may be disposed between a second bit line BL2 and a first selection line SL1, which intersect with each other. In addition, a gate electrode of the third ferroelectric memory element 110c of the third memory cell 100c may be connected to a second word line WL2. The fourth memory cell 100d may be disposed between the second bit line BL2 and the second selection line SL2, which intersect with each other. Further, a gate electrode of the fourth ferroelectric memory element 110d of the fourth memory cell 100d may be connected to the second word line WL2.

The nonvolatile memory device 10 may have an array of a plurality of memory cells 100a, 100b, 100c and 100d. Although only four memory cells are illustrated in FIG. 1, when a greater number of the bit lines $BL_1$ and $BL_2$, selection lines $SL_1$ and $SL_2$, and word lines $WL_1$ and $WL_2$ are utilized, additional memory cells may be arranged in a manner similar to the memory cells 100a, 100b, 100c and 100d.

A memory cell in the nonvolatile memory device 10, can be chosen for writing among the memory cells 100a, 100b, 100c and 100d. For example, when the first memory cell 100a is selected as a target memory cell to be written, the polarization state of the ferroelectric memory element 110a of the first memory cell 100a and the resistance state of the resistive memory element 120a of the first memory cell 100a are determined by a voltage provided by the word line WL1, bit line BL1, and selection line SL1, respectively, so that a plurality of electric signals which are distinguished from each other can be stored.

Figure 2A:
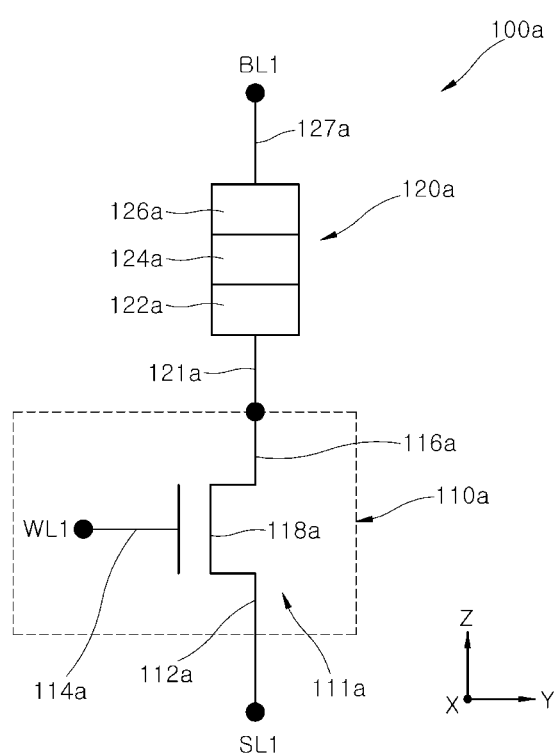
FIG. 2A is a view schematically illustrating a memory cell of a nonvolatile memory device according to an embodiment of the present disclosure.
Figure 2B:
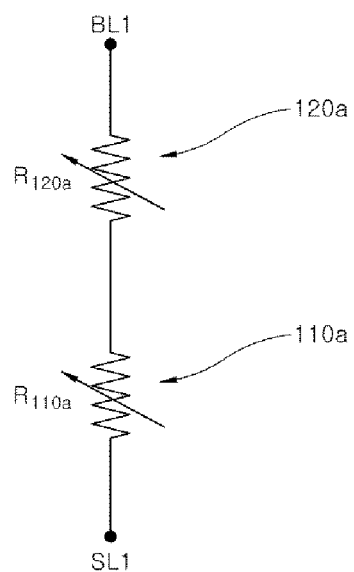
FIG. 2B is a circuit diagram illustrating an electrical circuit of the memory cell of FIG. 2A.

FIG. 2A is a view schematically illustrating a memory cell of a nonvolatile memory device according to an embodiment of the present disclosure. FIG. 2B is a circuit diagram illustrating an electrical circuit of the memory cell of FIG. 2A. In an embodiment, a memory cell 100a of FIGS. 2A and 2B is memory cell 100a included in the nonvolatile memory device 10 as described above and with reference to FIG. 1.

Referring to FIGS. 2A and 2B, a memory cell 100a may include a ferroelectric memory element 110a and a resistive memory element 120a. The ferroelectric memory element 110a and the resistive memory element 120a may be connected in series to each other through a first contact wiring 121a. That is, a channel resistance $R_{110a}$ of a field effect transistor 111a having the ferroelectric memory element 110a, and a resistance $R_{120}a$ of the resistive memory element 120a, may be connected in series to each other.

Referring to FIG. 2A, the ferroelectric memory element 110a may include the field effect transistor 111a having a ferroelectric gate dielectric layer 118a. A gate electrode layer 114a connected to a world line WL1 may be disposed on the ferroelectric gate dielectric layer 118a. A source electrode 112a and a drain electrode 116a may be disposed on opposite sides, respectively, of the ferroelectric gate dielectric layer 118a. The source electrode 112a may be connected to the selection line SL1. The drain electrode 116a may be connected to the first contact wiring 121a.

A voltage having a predetermined or known polarity may be applied to the gate electrode layer 114a by the word line WL1. When the applied voltage has a magnitude equal to or higher than a predetermined or preset threshold voltage, a polarization orientation of the ferroelectric gate dielectric layer 118a may be changed. A voltage with a magnitude equal to or higher than a predetermined or preset threshold voltage may be referred to as a polarization switching voltage of the ferroelectric memory element 110a. When the polarization switching voltage is removed from the gate electrode layer 114a, a remanent polarization, potentially changed in intensity, magnitude and/or orientation, may be stored in the ferroelectric gate dielectric layer 118a of the ferroelectric memory element 110a.

Under the influence of an electric field generated by the remanent polarization, conductive carriers such as electrons or holes can be induced to move into or out of a channel region in the substrate. In an embodiment, when a predetermined or preset polarization switching voltage having a positive polarity is applied to the gate electrode layer 114a, a polarization orientation formed in the ferroelectric gate dielectric layer 118a may result in electrons migrating into the channel region in the substrate beneath the ferroelectric gate dielectric layer 118a. As a result, when a reading voltage is subsequently applied to the gate electrode layer 114a, an electrical resistance between the source electrode 112a and the drain electrode 116a may decrease because more conductive carriers are in the channel region.

In another embodiment, when a predetermined or preset polarization switching voltage having a negative polarity is applied to the gate electrode layer 114a, a polarization orientation formed in the ferroelectric gate dielectric layer 118a may act to eject or repel electrons from the channel region in the substrate beneath the ferroelectric gate dielectric layer 118a. As a result, when a reading voltage is applied to the gate electrode layer 114a, the electrical resistance of the channel region between the source electrode 112a and the drain electrode 116a may increase because there are fewer conductive carriers in the channel region. Thus, the ferroelectric memory element 110a having the field effect transistor 111a can store, in a nonvolatile manner, different signal information corresponding to different polarization orientations.

The resistive memory element 120a can store at least two pieces of signal information in a nonvolatile manner. Resistive memory element 120a has an internal resistance that variably changes depending on the magnitude or polarity of an externally applied voltage. The resistive memory element 120a may include, for example, a phase change memory device or a resistance change memory device. Although, hereinafter, in an embodiment of the present disclosure, a resistance change memory device is described as the resistive memory element 120a, the present disclosure is not limited thereto. In other embodiments not illustrated, a phase change memory device may be applied as the resistive memory element 120a.

In an embodiment, the resistive memory element 120a may include a first memory electrode 122a, a variable resistance memory layer 124a, and a second memory electrode 126a, each sequentially disposed. The first memory electrode 122a may be connected to the drain electrode 116a of the field effect transistor 111a through the first contact wiring 121a. The variable resistance memory layer 124a may have an internal resistance that variably changes in response to an applied voltage. The second memory electrode 126a may be connected to the bit line $BL_1$ through a second contact wiring 127a.

In an embodiment, when a first resistance switching voltage equal to or higher than a predetermined or preset threshold voltage is applied between the first and second memory electrodes 122a and 126a, a conductive filament connecting the first and second memory electrodes 122a and 126a to each other may be formed inside the variable resistance memory layer 124a. When the conductive filament is formed, the resistance of the variable resistance memory layer 124a may be decreased. The state in which the conductive filament is formed, and in which the resistance of the variable resistance memory layer 124a is decreased, may be referred to as a 'low resistance state'. In addition, the first operation for changing resistive memory element 120a to the low resistance state may be referred to as a 'forming operation'. Even after the first resistance switching voltage is removed, the conductive filament may be retained in the variable resistance memory layer 124a, so that the low resistance state is stored as signal information.

In the low resistance state, when a second resistance switching voltage equal to or higher than a predetermined or preset threshold voltage is applied between the first and second memory electrodes 122a and 126a, at least a portion of the conductive filament may be degraded or dispersed. The removal or dispersal of the at least a portion of the conductive filament may be due to joule heat locally occurring in the conductive filament upon application of the second resistance switching voltage. When a portion of the conductive filament is degraded and the electrical connection between the first and second memory electrodes 122a and 126a is disconnected, the variable resistance memory layer 124a is no longer in a low resistance state and the resistance may be increased.

The state in which at least a portion of the conductive filament is removed or dispersed, causing the electrical resistance of the variable resistance memory layer 124a to increase, may be referred to as a 'high resistance state'. Also, the switching operation for changing the low resistance state to the high resistance state may be referred to as a 'reset' operation. Even after the second resistance switching voltage is removed, the conductive filament is degraded in the variable resistance memory layer 124a, so that the high resistance state can be stored as signal information.

Meanwhile, when a third resistance switching voltage equal to or higher than a known or preset threshold voltage is applied to the variable resistance memory layer 124a, which has been previously switched to the high resistance state by the reset operation, the conductive filament is restored so that the conductive filament can electrically connect the first and second memory electrodes 122a and 124a again. Accordingly, the resistance of the variable resistance memory layer 124a can de decreased, and the switching operation for changing the high resistance state to the low resistance state may be referred to as a 'set operation'. Even after the third resistance switching voltage is removed, the conductive filament may stay in the variable resistance memory layer 124a so that the low resistance state can be stored as signal information.

As described above, the resistive memory element 120a can store signal information corresponding to different resistance states in a nonvolatile manner. The resistance changes in the variable resistance memory layer 124a have been explained herein as occurring through repeated cycles of formation and partial disconnection of the conductive filament. However, the present disclosure is not necessarily limited thereto, and various other known operating methods can be applied to control resistance of the variable resistance memory layer 124a.

Referring again to FIGS. 2A and 2B, in an embodiment of the present disclosure, the drain electrode 116a of the field effect transistor 111a is electrically connected to the first memory electrode 122a of the resistive memory element 120a through the first contact wiring 121a. Thus, when a reading voltage is applied, an internal circuit of the memory cell 100a may have a configuration in which the channel resistance $R_{110}a$ of the field effect transistor 111a and the resistance $R_{120}a$ of the resistive memory element 120a are electrically connected in series to each other.

In an embodiment, the field effect transistor 111a may have a first channel resistance or a second channel resistance that each corresponds to a different remanent polarization of the ferroelectric gate dielectric layer. Meanwhile, the resistive memory element 120a may have a first resistance or a second resistance stored in the variable resistance memory layer 124a. The first and second channel resistances, and the first and second resistances stored in resistance memory layer 124a, may be controlled or set to have different values each other.

A writing operation for the ferroelectric memory element 110a and A writing operation for the resistive memory element 120a may be controlled independently with each other. As an example, during the writing operation for the resistive memory element 120a, the resistance of the resistive memory element 120a may be controlled without changing the channel resistance of the ferroelectric memory element 110a. As another example, during the writing operation for the ferroelectric memory element 110a, the channel resistance of the ferroelectric memory element 110a may be controlled without changing the resistance of the resistive memory element 120a. Therefore, the channel resistance of the ferroelectric memory element 110a and the resistance of the resistive memory element 120a are independent from each other. Accordingly, through the writing operation, the total resistance of the memory cell 100a, in which the first or second channel resistance and the first or second resistance are connected in series to each other, may be the sum of different combinations of the channel resistance and the resistance of resistance memory layer 124a. As an example, if the first and second channel resistances, and the first and second resistances are implemented in the memory cell 100a, then the total resistance may be implemented as one of four different combinations of resistances. As a result, multi-level signals on the basis of a plurality of resistance states in the ferroelectric memory element 110a and the resistive memory element 120a can be implemented in the memory cell 100a.

Meanwhile, in FIGS. 2A and 2B of an embodiment, the source electrode 112a is connected to the selection line $SL_1$, and the drain electrode 116a is connected to the first contact wiring 121a, but the present disclosure is not necessarily limited thereto. In some other embodiments, the source electrode 112a and the drain electrode 116a of the field effect transistor 111a may be arranged so that their positions are exchanged with each other.

In some other embodiments, when the resistive memory element 120a is a phase change memory device, the phase change memory device 120a may have a pair of electrode layers and a phase change layer disposed between the pair of electrode layers. When a resistance switching voltage of a predetermined or known magnitude is applied to the phase change memory device 120a, the phase change layer may be transformed into a crystalline state having a relatively low resistance, or into an amorphous state having a relatively high resistance, through joule heating from a current provided to the phase change layer.

Even after the resistance switching voltage applied to the phase change memory device 120a is removed, the phase change memory device 120a can maintain its transformed crystal state, as well as being capable of having different resistance states. As described above, one of the electrode layers of the pair in the phase change memory device 120a is electrically connected in series to the drain electrode of the ferroelectric memory element 110a, so a multi-level signal based on the plurality of possible combined resistance states can be implemented in the memory cell 100a.

Figure 3:
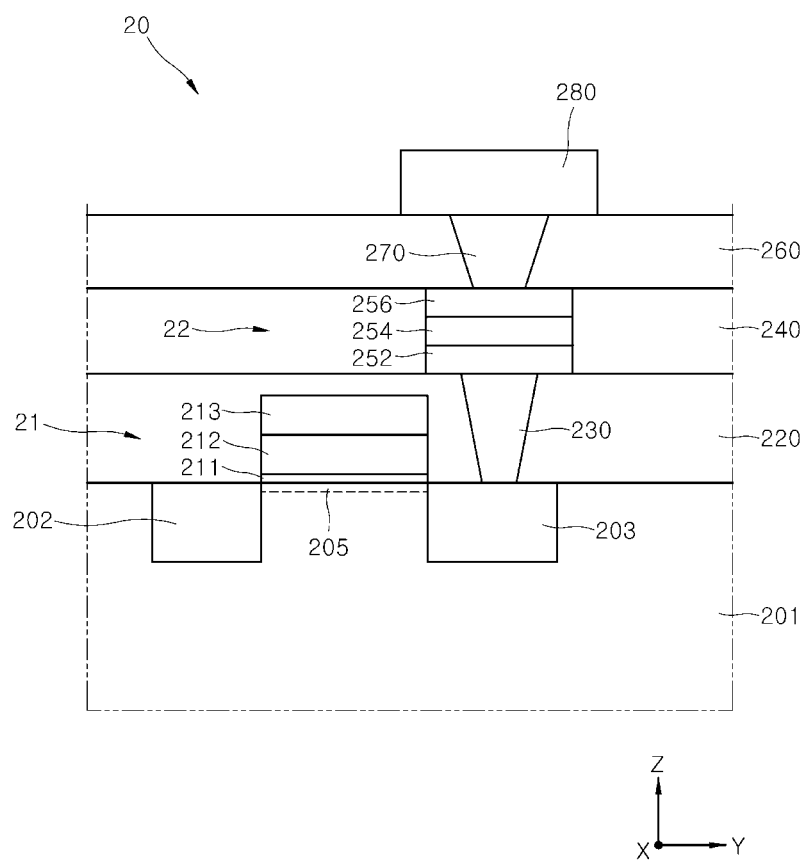
FIG. 3 is a cross-sectional view schematically illustrating a memory cell of a nonvolatile memory device according to an embodiment of the present disclosure.

FIG. 3 is a cross-sectional view schematically illustrating a memory cell 20 of a nonvolatile memory device according to an embodiment of the present disclosure.

Referring to FIG. 3, the memory cell 20 may include a ferroelectric memory element 21 and a resistive memory element 22. A configuration of the memory cell 20 may be used in the memory cells 100a, 100b, 100c and 100d described above and with reference to FIGS. 1, 2A, and 2B.

The ferroelectric memory element 21 may be a transistor type memory device disposed on a substrate 201. The ferroelectric memory element 21 may include an interfacial insulating layer 211, a ferroelectric gate dielectric layer 212 and a gate electrode layer 213 that are sequentially disposed on the substrate 201. A source electrode 202 and a drain electrode 203 may be disposed in the substrate 201 at opposite ends of the gate electrode layer 213.

The substrate 201 may include a semiconductor material. The substrate 201 may include, for example, silicon (Si) or germanium (Ge). As another example, the substrate 201 may include a composite semiconductor material such as gallium arsenide (GaAs). In embodiments, the substrate 201 may be a semiconductor substrate doped with a p-type dopant or an n-type dopant.

The interfacial insulating layer 211 may be interposed between the substrate 201 and the ferroelectric gate dielectric layer 212. The interfacial insulating layer 211 can function to suppress diffusion of materials between the substrate 201 and the ferroelectric gate dielectric layer 212 during the manufacturing of the ferroelectric memory element 21. The interfacial insulating layer 211 can prevent direct contact between the ferroelectric gate dielectric layer 212 and the substrate 201. The ferroelectric gate dielectric layer 212 and the substrate 201 may have crystal lattices of different sizes so that crystal defects are generated at the interface due to lattice strain. Such defects can be avoided with the utilization of an interfacial insulating layer 211.

The interfacial insulating layer 211 may include, for example, silicon oxide, silicon nitride, silicon oxynitride, or aluminum oxide. In an embodiment, when the substrate 201 is a silicon substrate, the interfacial insulating layer 211 may be a silicon oxide layer, a silicon nitride layer or a silicon oxynitride layer.

The ferroelectric gate dielectric layer 212 may be disposed on the interfacial insulating layer 211. The ferroelectric gate dielectric layer 212 may be a crystalline ferroelectric material layer having a remanent polarization. As described above, the remanent polarization can induce conductive carriers to move into or out of a channel region 205 in the substrate 201. As an example, when the ferroelectric memory element 21 takes the form of an N-type field effect transistor, under the remanent polarization in the ferroelectric gate dielectric layer 212, electrons may be induced in the channel region 205 as the conductive carrier, or induced to migrate away from the channel region 205. Accordingly, a channel resistance between the source electrode 202 and the drain electrode 203 can depend on the density of the electrons distributed in the channel region 205 during a reading operation.

The ferroelectric gate dielectric layer 212 may include a ferroelectric material. The ferroelectric gate dielectric layer 212 may include, for example, hafnium oxide ($HfO_2$), zirconium oxide ($ZrO_2$), lead zirconium titanium oxide ($PbZr_{0.5}Ti_{0.5}O_3$), barium titanium oxide ($BaTiO_3$), lead titanium oxide ($PbTiO_3$), hafnium zirconium oxide ($Hf_{0.5}Zr_{0.5}O_2$), lithium niobium oxide ($LiNbO_3$), lithium tantalum oxide ($LiTaO_3$), strontium bismuth tantalum oxide ($SrBi_2Ta_2O_9$), (bismuth, lanthanum) titanium oxide (($Bi,La)_4Ti_3O_{12}$)), bismuth titanium oxide ($Bi_4Ti_3O_{12}$), or a combination of two or more thereof.

In an embodiment, the ferroelectric gate dielectric layer 212 may include a dopant. The dopant may function to stabilize the ferroelectricity of the ferroelectric gate dielectric layer 212. The dopant may include, for example, carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

The gate electrode layer 213 may be disposed on the ferroelectric gate dielectric layer 212. The gate electrode layer 213 may include a conductive material. The gate electrode layer 213 may include, for example, titanium (Ti), tantalum (Ta), tungsten (W), titanium nitride (TiN), tantalum nitride (TaN), tungsten nitride (WN), or a combination of two or more thereof. The gate electrode layer 213 may include, as another example, conductive metal carbide, or conductive metal silicide. The gate electrode layer 213 may be connected to a word line (not shown in FIG. 3).

The source electrode 202 and the drain electrode 203 may be disposed to be spaced apart from each other at the ends of interfacial insulating layer 211. The source electrode 202 and the drain electrode 203 may be regions formed by doping the substrate 201 with a dopant. In an embodiment, the source electrode 202 and the drain electrode 203 may be doped with a dopant of an opposite conductivity type to that of the substrate 201 when the substrate 201 is doped with an n-type dopant or a p-type dopant. The source electrode 202 and the drain electrode 203 may be connected to a selection line (not shown in FIG. 3).

A field effect transistor having the ferroelectric gate dielectric layer 212 and the gate electrode layer 213 sequentially stacked on the substrate 201 is described above. The field effect transistor may be used in the ferroelectric memory element 21 of the ferroelectric memory cell 20.

Referring again to FIG. 3, a first interlayer insulating layer 220 may be disposed on the drain electrode 203. The resistive memory element 22 may be disposed on the first interlayer insulating layer 220. The resistive memory element 22 may include a first memory electrode 252, a resistance change memory layer 254 and a second memory electrode 256. The first memory electrode 252 may be electrically connected to the drain electrode 203 through a first contact wiring 230. The first contact wiring 230 may penetrate through the first interlayer insulating layer 220. The first contact wiring 230 may include, for example, a conductive material such as tungsten (W), tungsten nitride (WN), titanium (Ti), titanium nitride (TiN), copper (Cu), aluminum (Al) and the like.

The first memory electrode 252 may include, for example, metal, conductive metal nitride, conductive metal oxide and the like. The first memory electrode 252 may include, for example, gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), ruthenium oxide (RuO2) and the like.

The resistance change memory layer 254 may include a material whose resistance varies between a high resistance state and a low resistance state in response to an externally applied voltage. The resistance change memory layer 254 may include, as an example, titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. The resistance change memory layer 254 may include, as another example, PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YBa_2Cu_3O_{7-x}$, $0<x<1$), (Ba, Sr)TiO$_3$(Cr-doped, Nb-doped), SrZrO$_3$(Cr-doped, V-doped), (La, Sr)MnO$_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, $YBa_2Cu_3O_7$, or a combination of two or more thereof. The resistance change memory layer 254 may include, as yet another example, germanium-antimony-tellurium (Ge—Sb—Te, GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $Ge_xSe_{1-x}$ ($0<x<1$), silver sulfide (Ag$_2$S), copper sulfide (Cu$_2$S), cadmium sulfide (CdS), zinc sulfide (ZnS), selenium oxide (CeO$_2$), or a combination of two or more thereof.

The resistive memory element 22 may be isolated from its surroundings by a second interlayer insulating layer 240. A third interlayer insulating layer 260 may be disposed on the resistive memory element 22. A bit line 280 may be disposed on the third interlayer insulating layer 260. The bit line 280 may be electrically connected to the second memory electrode 256 of the resistive memory element 22 by a second contact wiring 270. The second contact wiring 270 may penetrate through the third interlayer insulating layer 260. The second contact wiring 270 may include a conductive material such as tungsten (W), tungsten nitride, titanium (Ti), titanium nitride, copper (Cu), aluminum (Al) and the like, for example.

As described above, the resistive memory element 22 including the first memory electrode 252, the resistance change memory layer 254 and the second memory electrode 256, sequentially stacked on the first interlayer insulating layer 220. The memory cell 20 may include both the resistive memory element 22 and the ferroelectric memory element 21.

In FIG. 3, the source electrode 202 is connected to the selection line and the drain electrode 203 is connected to the first contact wiring 230, but the present disclosure is not necessarily limited thereto. In other embodiments, the source electrode 202 and the drain electrode 203 may be disposed so that their positions are swapped with each other with respect to FIG. 3.

Figure 4A:
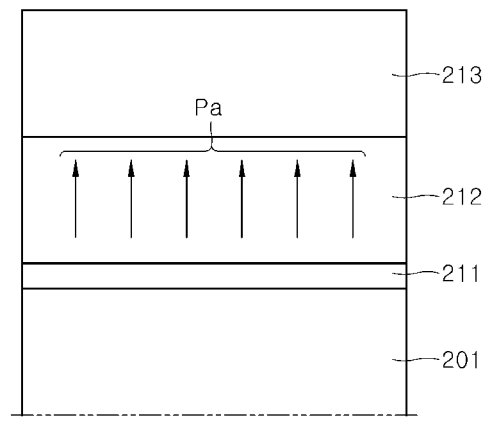
Figure 4B:
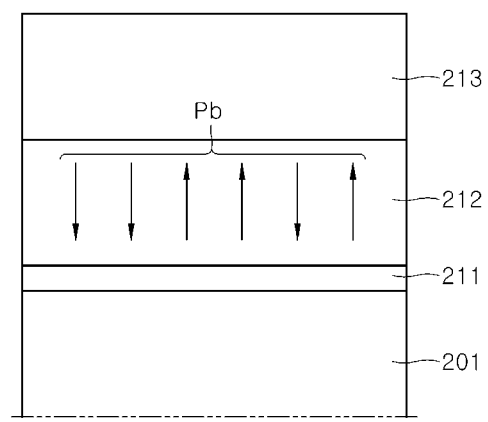

FIGS. 4A to 4C are cross-sectional views schematically illustrating a writing method of a ferroelectric memory element according to an embodiment of the present disclosure.

The ferroelectric memory element may be utilized in the ferroelectric memory element 21 described above and with reference to FIG. 3. Hereinafter, for convenience of description, the ferroelectric memory element 21 is exemplified as including an N-type field effect transistor, but the present disclosure is not limited thereto. It should be understood that the same mechanisms and methods can be used even if the ferroelectric memory element includes a P-type or other kinds of field effect transistors.

Referring to FIG. 4A, when a polarization switching voltage having a negative polarity is applied to a gate electrode layer 213, polarization $P_a$ may be uniformly formed in a ferroelectric gate dielectric layer 212 oriented toward the gate electrode layer 213. The polarization $P_a$ may act as an electrically repulsive force on the electrons of the substrate 201 to repel the electrons from a channel region in the substrate 201.

Referring to FIGS. 4B and 4C, first and second polarization switching voltages each having a positive polarity may be applied, through gate electrode layer 213, to the ferroelectric gate dielectric layer 212. Both first and second polarization switching voltages may be greater than a threshold voltage with a magnitude capable of switching a polarization orientation, such as Pa for example, in the ferroelectric gate dielectric layer 212. When the first and second polarization switching voltages are applied in the form of pulses, the amplitude of the second polarization switching voltage that corresponds to FIG. 4C may be selected to be greater than the amplitude of the first polarization switching voltage that corresponds to FIG. 4B. Alternatively, the pulse time (i.e., width) of the second polarization switching voltage may be designed to be greater than the pulse time (i.e., width) of the first polarization switching voltage. Accordingly, in contrast to the rate at which the polarization orientation is created by the first polarization switching voltage as reflected in FIG. 4B, the rate at which the polarization orientation is switched by the second polarization switching voltage resulting in the polarization shown in FIG. 4C, may be relatively great.

Referring to FIG. 4C, polarization $P_c$ may be uniformly distributed and aligned toward the substrate 201 so that electrons are attracted into the channel region in the substrate 201. Referring to FIG. 4B, polarization $P_b$ may have a mixed orientation state between the polarization $P_a$ of FIG. 4A and the polarization $P_c$ of FIG. 4C. Therefore, the electrical attraction force of the polarization in FIG. 4B acting on the electrons of the substrate 201 may be less than the electrical attraction force of the polarization in of FIG. 4C.

Consequently, the polarization orientations Pa, Pb and Pc in the ferroelectric gate dielectric layer 212 of FIGS. 4A to 4C can be distinguished from each other. Thus, a plurality of different polarization orientations corresponding to signal information, for example, '0', '1' and '2', can be implemented in the ferroelectric gate dielectric layer 212 by controlling the polarity, magnitude, frequency and/or application time of applied polarization switching voltages. When a reading voltage is applied to the gate electrode layer 213, the channel resistances of different magnitudes that correspond to the plurality of polarization orientations can be sensed.

Figure 5A:
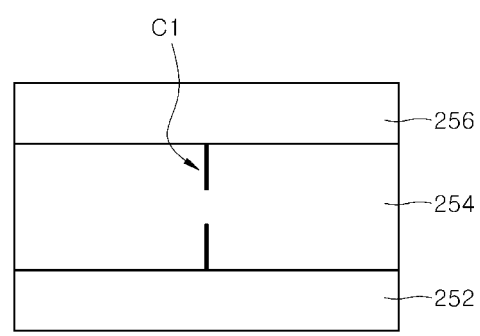
FIGS. 5A to 5C are views schematically illustrating a writing method of a resistive memory element according to an embodiment of the present disclosure.
Figure 5B:
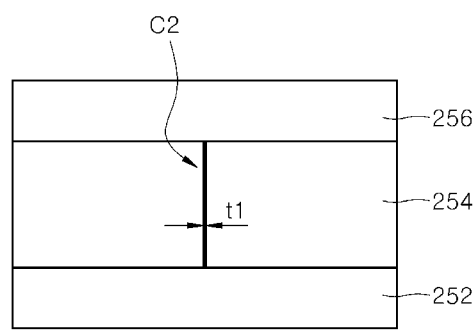
Figure 5C:
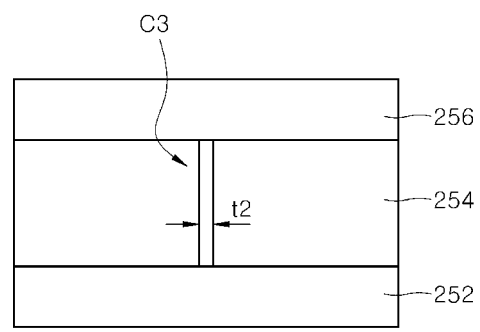

FIGS. 5A to 5C are views schematically illustrating a writing method of a resistive memory element according to an embodiment of the present disclosure. The resistive memory element may be used in the resistive memory element 22 of the embodiment described above and with reference to FIG. 3.

Referring to FIG. 5A, after the above-described reset operation, at least a portion of a conductive filament C1 has been broken between first and second memory electrodes 252 and 256. Accordingly, a resistance change memory layer 254 can store a high resistance state.

Referring to FIGS. 5B and 5C, the above-described set operation may next be performed. That is, first and second resistance switching voltages may be applied between the first and second memory electrodes, respectively. The first and second resistance switching voltages may each be a voltage equal to or higher than a threshold voltage that restores the interrupted portion of the conductive filament, so that the conductive filament electrically re-connects the first and second memory electrodes 252 and 256 to each other.

When the first and second resistance switching voltages are applied in the form of pulses, the amplitude of the second resistance switching voltage that corresponds to FIG. 5C may be set to be greater than the amplitude of the first resistance switching voltage that corresponds to FIG. 5B. Alternatively, the pulse time (i.e., width) of the second resistance switching voltage may be selected to be greater than the pulse time (i.e., width) of the first resistance switching voltage.

Accordingly, the width $t_2$ of the conductive filament C3 illustrated in FIG. 5C may be greater than the width $t_1$ of the conductive filament C2 illustrated in FIG. 5B. As a result, the conductivity of the electrons through the conductive filament C3 of FIG. 5C may be greater than the conductivity of the electrons through the conductive filament C2 of FIG. 5B. The resistance through conductive filament C3 may be less than the resistance through conductive filament C2.

Consequently, a plurality of different resistances corresponding to signal information, for example, '0', '1' and '2', can be implemented in the resistance change memory layer 254 by controlling the polarity, magnitude or other characteristics of the resistance switching voltage. Further, when a reading voltage is applied between the first and second memory electrodes 252 and 256, resistances of different magnitudes that correspond to different polarizations can be sensed.

Figure 6:
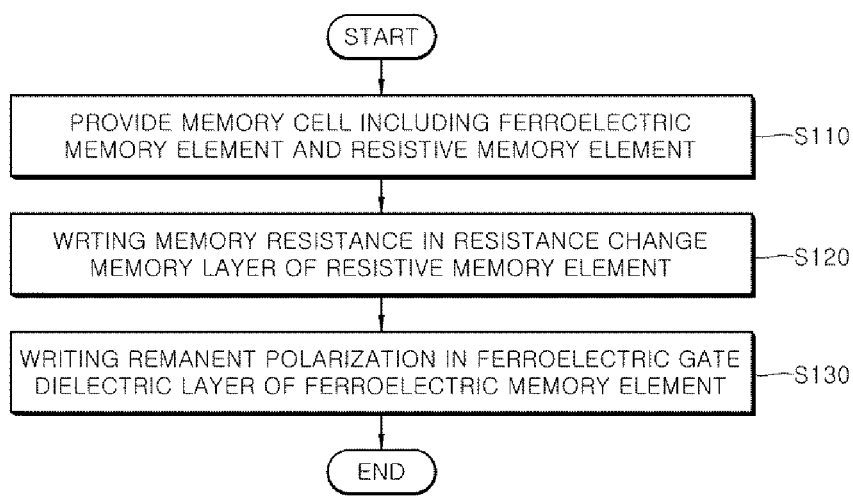
FIG. 6 is a flow chart illustrating a writing method of a nonvolatile memory device according to an embodiment of the present disclosure.

FIG. 6 is a flow chart illustrating a writing method of a nonvolatile memory device according to an embodiment of the present disclosure. The writing method of the nonvolatile memory device of FIG. 6 may corresponds to the writing method of the nonvolatile memory device 10 described above and with reference to FIGS. 1, 2A and 2B and the memory cell 20 described above and with reference to FIGS. 3, 4A to 4C, and 5A to 5C.

Referring to operation S110 of FIG. 6, a memory cell having a ferroelectric memory element and a resistive memory element may be provided. In an embodiment, the ferroelectric memory element may include a field effect transistor having a ferroelectric gate dielectric layer. The resistive memory element may include a first memory electrode, a resistance change memory layer and a second memory electrode. A drain electrode of the field effect transistor may be electrically connected to one of either the first or the second memory electrodes.

Referring to operation S120 of FIG. 6, a resistance writing voltage may be applied to the resistance change memory layer of the resistive memory element to write a resistance in the resistive memory element.

In an embodiment, a predetermined or preset resistance switching voltage equal to or higher than a threshold voltage may be applied between the first and second memory electrodes of the resistive memory element to change a resistance state in the resistance change memory layer. Therefore, at least two different resistances are possible in the resistive memory element.

Referring to operation S130 of FIG. 6, a polarization writing voltage may be applied to a gate electrode of the field effect transistor to write a remanent polarization in the ferroelectric gate dielectric layer. In an embodiment, a predetermined polarization switching voltage equal to or higher than a threshold voltage may be applied to a gate electrode. Thus, at least two different remanent polarizations can be written in the ferroelectric gate dielectric layer.

Operation S120 and operation S130 may be sequentially performed. In addition, the operation of writing the resistances in operation S120 and the operation of writing the remanent polarization in operation S130 may be controlled independently with each other. As an example, during the operation S120, the resistance in the resistance change memory layer may be controlled without changing the remanent polarization in the ferroelectric gate dielectric layer. As another example, during the operation 130, the remanent polarization in the ferroelectric gate dielectric layer be controlled without changing the resistance in the resistive change memory layer. Therefore, the remanent polarization and the resistance are independent from each other.

The at least two different resistances and the at least two different remnant polarization may be independently written so that a plurality of levels of signal information according to the combinations of the resistances and the remnant polarizations can be stored in the memory cell. As an example, when the first resistance a and second resistance b are implemented as the resistance and the first polarization c and second polarization state d are implemented as the remnant polarization, four different signal information can be written in the nonvolatile memory device (e.g., ac, ad, bc, or bd) according to embodiments of the present disclosure.

Figure 7:
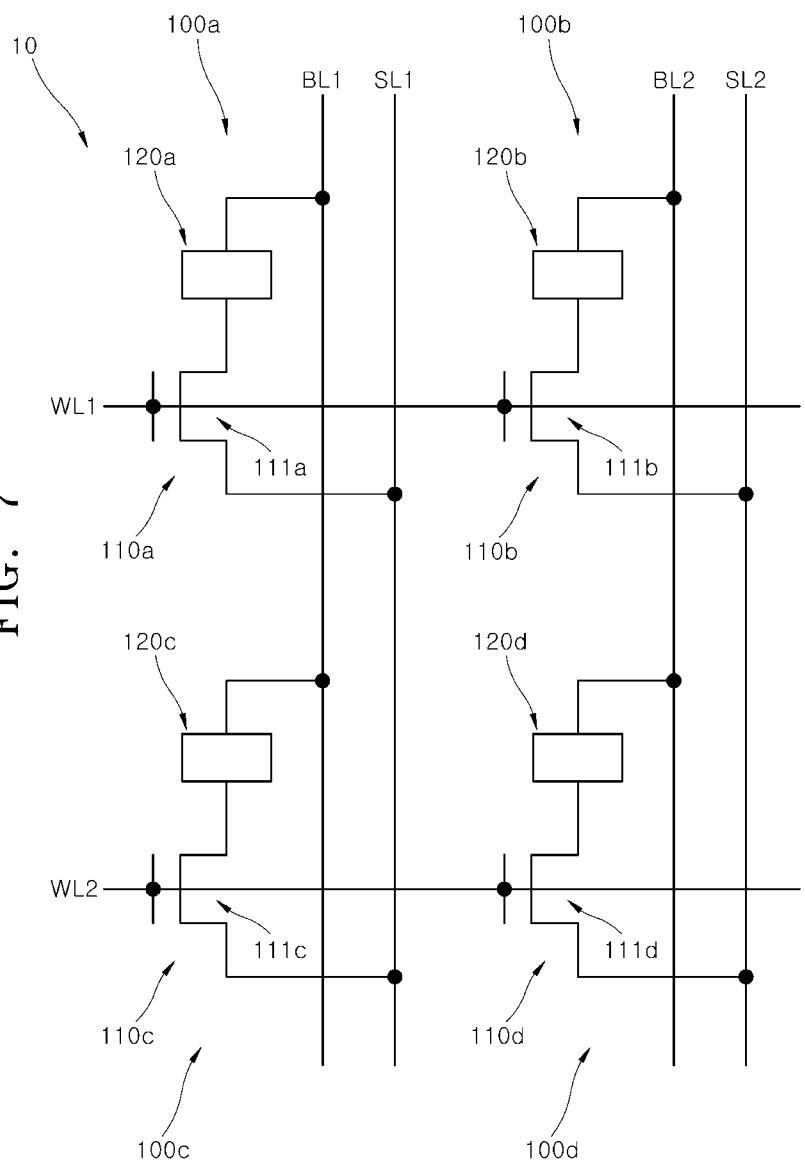
FIG. 7 is a circuit diagram schematically illustrating a method of operating a nonvolatile memory device according to an embodiment of the present disclosure.

FIG. 7 is a circuit diagram schematically illustrating a method of operating a nonvolatile memory device according to an embodiment of the present disclosure.

Referring to FIG. 7, a nonvolatile memory device 10 having an array of a plurality of memory cells 100a, 100b, 100c and 100d may be provided. The nonvolatile memory device 10 of FIG. 7 may be substantially the same as the nonvolatile memory device 10 described above and with reference to FIGS. 1, 2A and 2B. Thus, a detailed description for the nonvolatile memory device 10 will be omitted.

In a writing method of the nonvolatile memory device 10, a target memory cell may be chosen from the memory cells 100a, 100b, 100c and 100d. Hereinafter, for convenience of description, a first memory cell 100a may be selected as the target memory cell. The first memory cell 100a may include a first ferroelectric memory element 110a and a first resistive memory element 120a. The first ferroelectric memory element 110a may include a first field effect transistor 111a. A gate electrode of the first field effect transistor 111a may be connected to a first word line WL1, and a source electrode of the first field effect transistor 111a may be connected to a first selection line SL1. One end of the first resistive memory element 120a may be connected to a first bit line BL1, and the other end of the first resistive memory element 120a may be connected to a drain electrode of the first field effect transistor 111a.

In an embodiment, a writing operation for the first memory cell 100a may be performed by writing a resistance for the first resistive memory element 120a and then writing remanent polarization for the first ferroelectric memory element 110a.

In an embodiment, the operation of writing the resistance in the first resistive memory element 120a may include a first operation of turning on the first field effect transistor 111a using a first resistance writing voltage applied to the first word line WL1, and a second operation of writing a predetermined resistance in a resistance change memory layer of the first resistive memory element 120a by using a second resistance writing voltage applied between the first selection SL1 and the first bit line BL1. The second resistance writing voltage may be the resistance switching voltage for the first resistive memory element 120a. At this time, the second operation of writing the resistance in the resistance change memory layer may include controlling the polarity, magnitude or other characteristics of the second resistance writing voltage to write any one of at least two or more different resistances.

Field effect transistors 111b, 111c and 111d of the second to fourth memory cells 100b, 100c and 100d may be turned off, or the voltage between the select lines SL1 and SL2 and the bit lines BL1 and BL2 may be maintained at 0 V, respectively, while the operation of writing the predetermined resistance in the first resistive memory element 120a proceeds.

As embodiments described above and with reference to FIGS. 5A to 5C, the polarity, magnitude and other characteristics of the second resistance writing voltage applied to the first resistive memory element 120a may be controlled so that a plurality of resistances corresponding to signal information of, for example, '0', '1' and '2', can be written in the resistance change memory layer.

Meanwhile, the operation of writing the remanent polarization in the ferroelectric gate dielectric layer of the first field effect transistor 111a may include applying a first polarization writing voltage of the same magnitude to the first selection line SL1 and the first bit line BL1, and controlling the second polarization writing voltage provided through the first word line WL1 to produce the remanent polarization of the ferroelectric gate dielectric layer. The second polarization writing voltage may be the polarization switching voltage for the first field effect transistor 111a.

During the operation of writing the polarization in the ferroelectric gate dielectric layer of the first field effect transistor 111a, a voltage less than a predetermined or preset threshold voltage may be applied to the gate electrode layers of the second to fourth field effect transistors 100b, 100c and 100d, so that any previously written remanent polarization in those resistors cannot be switched.

With respect to embodiments described above and with reference to FIGS. 4A to 4C, it is possible to write a plurality of remanent polarization corresponding to signal information of, for example, '0', '1' and '2', respectively in the ferroelectric gate dielectric layer by controlling the polarity, magnitude and other characteristics of a second polarization writing voltage applied to the ferroelectric gate dielectric layer of the first field effect transistor 111a.

In an embodiment, a reading method of the nonvolatile memory device 10 may include an operation of turning on the first field effect transistor 111a by applying a first reading voltage to the first word line WL1 of the first memory cell 100a, which is the target memory cell, and an operation of reading a channel resistance of the first field effect transistor 111a, and reading a resistance of a resistance change memory layer of the first resistive memory element 120a by applying a second reading voltage between the first selection line SL1 and the second bit line BL1. At this time, an absolute value of the first reading voltage applied to the first field effect transistor 111a may be less than an absolute value of the polarization writing voltage applied to the first field effect transistor 111a. Accordingly, the remanent polarization orientation stored in the ferroelectric gate dielectric layer will not be changed by the first reading voltage. The channel resistance of the first field effect transistor 111a may be determined corresponding to the remanent polarization stored in the ferroelectric gate dielectric layer.

Figure 8:
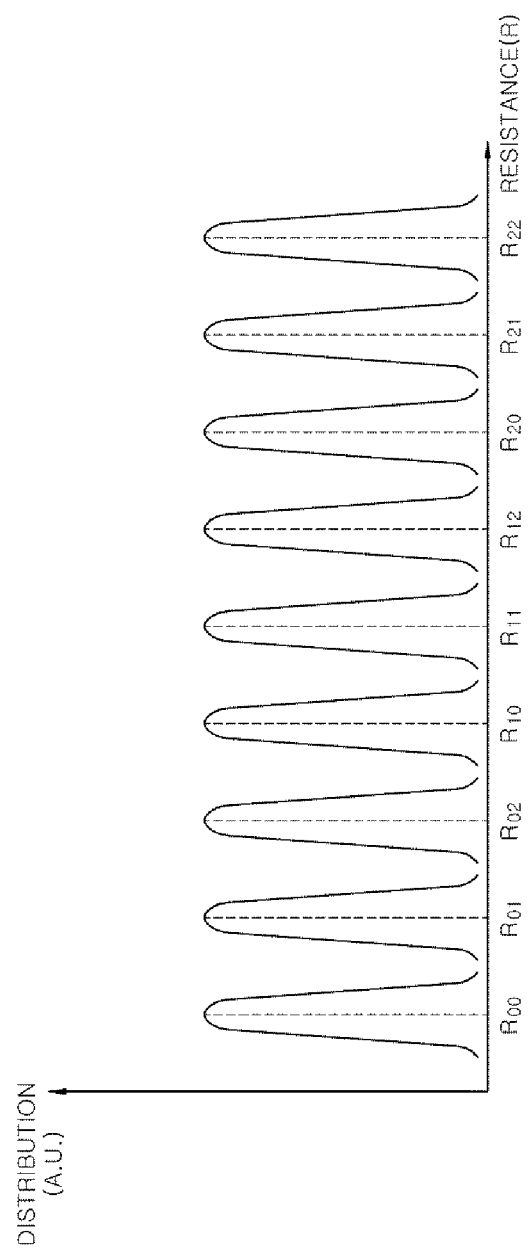
FIG. 8 is a graph schematically illustrating a plurality of resistance levels of a nonvolatile memory device according to an embodiment of the present disclosure.

FIG. 8 is a graph schematically illustrating a plurality of resistance levels of a memory cell of a nonvolatile memory device according to an embodiment of the present disclosure.

In an embodiment, a plurality of resistance levels $R_{00}$, $R_{01}$, $R_{02}$, $R_{10}$, $R_{11}$, $R_{12}$, $R_{20}$, $R_{21}$ and $R_{22}$ shown in FIG. 8 may be implemented by the nonvolatile memory device that includes a ferroelectric gate dielectric layer having a plurality of polarization states corresponding to the signal information of '0', '1' and '2' described above and with reference to FIGS. 4A to 4C, and a resistance change memory layer having a plurality of resistance states corresponding to the signal information of '0', '1' and '2' described above and with reference to FIGS. 5A to 5C.

According to embodiments of the present disclosure, three different polarization states and three different resistance states are combined with each other so that nine different signal information in total can be implemented.

In some other embodiments, a greater level of signal information can be stored in a single memory cell by controlling the polarization state of the ferroelectric gate dielectric layer and the resistance state of the resistance change memory layer such that at least four states can be stored in each.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a ferroelectric memory element and a resistive memory element,
wherein the ferroelectric memory element comprises a field effect transistor having a ferroelectric gate dielectric layer,
the resistive memory element comprises a resistance change memory layer disposed between a first memory electrode and a second memory electrode, and
a drain electrode of the field effect transistor is connected to the first memory electrode or the second memory electrode,
wherein the resistance change memory layer includes a conductive filament electrically connecting the first and the second memory electrode,
wherein the conductive filament has a first width in a first state and a second width in a second state, and
wherein the first width is greater than the second width, such that the electron conductivity through the conductive filament varies based on the width.

2. The nonvolatile memory device of claim 1, wherein the ferroelectric gate dielectric layer has a remanent polarization, and the resistance change memory layer has a resistance, and the remanent polarization and the resistance are independent from each other.

3. The nonvolatile memory device of claim 1, wherein the ferroelectric gate dielectric layer has one of at least two remanent polarization states.

4. The nonvolatile memory device of claim 3, wherein the ferroelectric memory element has a channel resistance state corresponding to the stored remanent polarization state.

5. The nonvolatile memory device of claim 1, wherein the resistance change memory layer has one of at least two resistance states.

6. The nonvolatile memory device of claim 1, wherein the field effect transistor comprises:
a semiconductor substrate;
a crystalline ferroelectric material layer disposed on the semiconductor substrate;
a gate electrode layer disposed on the ferroelectric material layer;
a drain electrode and a source electrode disposed in the semiconductor substrate at opposite ends of the gate electrode layer.

7. The nonvolatile memory device of claim 6, wherein the resistive memory element comprises the first memory electrode, the resistance change memory layer and the second memory electrode sequentially disposed on the semiconductor substrate,
and wherein the first memory electrode is connected to the drain electrode.

8. The nonvolatile memory device of claim 6, wherein the semiconductor substrate comprises one of silicon (Si), gallium arsenide (GaAs), indium phosphide (InP), germanium (Ge), and silicon germanium (SiGe).

9. The nonvolatile memory device of claim 6, wherein the semiconductor substrate is doped with an n-type dopant or a p-type dopant.

10. The nonvolatile memory device of claim 1, wherein the ferroelectric gate dielectric layer comprises at least one selected from the group consisting of hafnium oxide ($HfO_2$), zirconium oxide ($ZrO_2$), lead zirconium titanium oxide ($PbZr_{0.5}Ti_{0.5}O_3$), barium titanium oxide ($BaTiO_3$), lead titanium oxide ($PbTiO_3$), hafnium zirconium oxide ($Hf_{0.5}Zr_{0.5}O_2$), lithium niobium oxide ($LiNbO_3$), lithium tantalum oxide ($LiTaO_3$), strontium bismuth tantalum oxide ($SrBi_2Ta_2O_9$), (bismuth, lanthanum) titanium oxide (($Bi, La)_4Ti_3O_{12}$)), and bismuth titanium oxide ($Bi_4Ti_3O_{12}$).

11. The nonvolatile memory device of claim 10, wherein the ferroelectric gate dielectric layer comprises a dopant, and
the dopant comprises at least one selected from the group consisting of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), and lanthanum (La).

12. The nonvolatile memory device of claim 1, wherein the resistance change memory layer comprises at least one selected from the group consisting of titanium oxide, aluminum oxide, nickel oxide, copper oxide, zirconium oxide, manganese oxide, hafnium oxide, tungsten oxide, tantalum oxide, niobium oxide, iron oxide, PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_3-\delta$), YBCO ($YBa_2Cu_3O_{7-x}$, $0<x<1$), (Ba, Sr)$TiO_3$(Cr-doped, Nb-doped), $SrZrO_3$(Cr-doped, V-doped), (La, Sr)$MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, $YBa_2Cu_3O_7$, germanium-antimony-tellurium (Ge—Sb—Te; GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $Ge_xSe_{1-x}$ ($0<x<1$), silver sulfide ($Ag_2S$), copper sulfide ($Cu_2S$), cadmium sulfide (CdS), zinc sulfide (ZnS), and selenium oxide ($CeO_2$).

* * * * *